US011089699B2

(12) United States Patent
Park et al.

(10) Patent No.: US 11,089,699 B2
(45) Date of Patent: *Aug. 10, 2021

(54) ROLLABLE DISPLAY

(71) Applicant: LG Display Co., Ltd., Seoul (KR)

(72) Inventors: HeongSoo Park, Goyang-si (KR);
SeungHee Lee, Goyang-si (KR); MiJin Han, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/846,203

(22) Filed: Apr. 10, 2020

(65) Prior Publication Data

US 2020/0245477 A1    Jul. 30, 2020

Related U.S. Application Data

(62) Division of application No. 16/177,048, filed on Oct. 31, 2018, now Pat. No. 10,694,625.

(30) Foreign Application Priority Data

Oct. 31, 2017  (KR) .................. 10-2017-0144082
Oct. 8, 2018   (KR) .................. 10-2018-0119836

(51) Int. Cl.
*G06F 1/16*    (2006.01)
*H05K 5/00*    (2006.01)
(Continued)

(52) U.S. Cl.
CPC ......... *H05K 5/0017* (2013.01); *G06F 1/1652* (2013.01); *G09F 9/301* (2013.01);
(Continued)

(58) Field of Classification Search
CPC .... G06F 1/1618; G06F 1/1641; G06F 1/1652; H04M 1/0268
See application file for complete search history.

(56) References Cited

U.S. PATENT DOCUMENTS 6,016,176 A * 1/2000 Kim ...................... G06F 1/1683
                                                            349/84
6,144,550 A * 11/2000 Weber ................... G06F 1/1613
                                                            345/903
(Continued)

FOREIGN PATENT DOCUMENTS

CN         2777620 Y      5/2006
CN       101814258 A      8/2010
(Continued)

OTHER PUBLICATIONS

Chinese Office Action dated Aug. 5, 2020 issued in corresponding Patent Application No. 201811286009.8 with English Translation (22 pages).

(Continued)

*Primary Examiner* — Adrian S Wilson
(74) *Attorney, Agent, or Firm* — Polsinelli PC

(57) ABSTRACT

Disclosed is a rollable display, which prevents slippage between a flexible display panel and a back plate attached to the flexible display panel for supporting the same. The rollable display has a feature in different patterns of the back plate for each area. In addition, the rollable display has a feature in that a display unit is foldable and non-foldable via a link unit so as not to be folded or rolled multiple times in the same direction.

8 Claims, 14 Drawing Sheets

(51) Int. Cl.
*G09F 9/30* (2006.01)
*H04M 1/02* (2006.01)
*H01L 51/52* (2006.01)
*H05K 1/18* (2006.01)
*H05K 5/02* (2006.01)
*H01L 27/32* (2006.01)

(52) U.S. Cl.
CPC ........ *H01L 51/524* (2013.01); *H04M 1/0268* (2013.01); *H05K 1/189* (2013.01); *H05K 5/0217* (2013.01); *H01L 27/323* (2013.01); *H01L 27/3276* (2013.01); *H01L 2251/5338* (2013.01); *H05K 2201/10128* (2013.01)

(56) References Cited

U.S. PATENT DOCUMENTS

| | | | | |
|---|---|---|---|---|
| 6,806,850 | B2 | 10/2004 | Chen | |
| 7,710,370 | B2 * | 5/2010 | Slikkerveer | G09F 9/301 345/85 |
| 7,869,204 | B2 * | 1/2011 | Bair | G06F 1/1641 361/679.3 |
| 8,382,296 | B2 * | 2/2013 | Itoh | G06F 1/1639 353/119 |
| 8,493,726 | B2 * | 7/2013 | Visser | G09F 9/301 361/679.3 |
| D760,218 | S * | 6/2016 | Yamazaki | D14/341 |
| D760,219 | S * | 6/2016 | Yamazaki | D14/341 |
| 9,983,424 | B2 * | 5/2018 | Kim | G02F 1/133308 |
| 10,013,028 | B2 * | 7/2018 | Ahn | G09F 9/301 |
| 10,095,273 | B2 * | 10/2018 | Choi | G06F 1/1641 |
| 10,136,524 | B2 * | 11/2018 | Choi | G06F 1/1601 |
| 10,194,543 | B2 * | 1/2019 | Seo | G06F 1/1626 |
| 10,215,332 | B2 * | 2/2019 | Lee | G06F 1/1616 |
| 10,694,625 | B2 * | 6/2020 | Park | H04M 1/0268 |
| 2002/0118151 | A1 * | 8/2002 | Chen | G06F 1/1639 345/84 |
| 2003/0218860 | A1 * | 11/2003 | Shiraiwa | G06F 1/1616 361/679.04 |
| 2009/0021666 | A1 | 1/2009 | Chen et al. | |
| 2011/0043976 | A1 * | 2/2011 | Visser | G09F 9/301 361/679.01 |
| 2011/0227822 | A1 * | 9/2011 | Shai | G06F 1/1641 345/156 |
| 2013/0201208 | A1 | 8/2013 | Cho et al. | |
| 2013/0335929 | A1 * | 12/2013 | Cavallaro | G06F 1/1652 361/749 |
| 2015/0255522 | A1 | 9/2015 | Sato et al. | |
| 2015/0382446 | A1 | 12/2015 | Kwon et al. | |
| 2016/0320804 | A1 | 11/2016 | Takayanagi et al. | |
| 2016/0357052 | A1 * | 12/2016 | Kim | H01L 51/5237 |
| 2017/0170417 | A1 | 6/2017 | Myung et al. | |

FOREIGN PATENT DOCUMENTS

| | | |
|---|---|---|
| CN | 103069473 A | 4/2013 |
| CN | 203517224 U | 4/2014 |
| CN | 105514115 A | 4/2016 |
| CN | 205881905 U | 1/2017 |
| CN | 106373490 A | 2/2017 |
| CN | 106816094 A | 6/2017 |
| CN | 107102692 A | 8/2017 |
| EP | 3 173 897 A1 | 5/2017 |
| KR | 10-2009-0075331 A | 7/2009 |

OTHER PUBLICATIONS

European Search Report dated Feb. 28, 2019 issued in the corresponding European Patent Application No. 18203699.6, pp. 1-8.
Chinese Office Action dated Feb. 8, 2021 issued in Patent Application No. 201811286009.8 w/English Translation (24 pages).

* cited by examiner

ROLLABLE DISPLAY

CROSS REFERENCE TO RELATED APPLICATIONS

This application is a Divisional of application Ser. No. 16/177,048, filed Oct. 31, 2018, which claims priority to and the benefit of Korean Patent Application Nos. 10-2017-0144082 filed on Oct. 31, 2017 and 10-2018-0119836 filed on Oct. 8, 2018, all of which are hereby incorporated by reference in their entirety as if fully set forth herein.

BACKGROUND

Field of the Disclosure

The present disclosure relates to a rollable display, and more particularly, to a rollable display, which prevents slippage between a display panel and a back plate for supporting the same.

Description of the Background

An image display, which reproduces various pieces of information on a screen, is a core technology of the information and communication age, and is being developed in the direction of becoming thinner, lighter, and having higher performance. Thus, as a flat panel display capable of reducing the disadvantageous weight and volume of a cathode ray tube (CRT), for example, an organic light-emitting display, which enables self-luminescence and obviates a light source unit, is in the spotlight.

In such an organic light-emitting display, a plurality of pixels is arranged in a matrix form to display an image. Here, each pixel includes a light-emitting element and a pixel-driving circuit constituted by a plurality of transistors, which drive the light-emitting element independently of each other.

Recently, with regard to various applications, there is increasing demand for a flexible display, which is easy to carry in a pocket or a small pouch and is capable of displaying an image on a larger screen than when being carried. Such a flexible display is folded or partially bent when it is carried or stored, but is unfolded when displaying an image, which may increase an image display area and may cause an increase in user visual sensation and viewing realism.

In particular, among various shapes of flexible display devices, a lot of research has been conducted on a rollable display due to the advantages of superior portability and an increase in the area of a display when unrolled compared to when rolled.

FIG. 1 is a view illustrating a typical rollable display.

As illustrated in FIG. 1, a display panel 10 is attached onto a plate 20 having supporting force to constitute a display unit. Then, in the state in which the display unit is wound around a single-axis roller (not illustrated), the end of the display unit is unwound from the roller in order to use the display unit for display.

Here, an adhesive layer (not illustrated) is disposed between the display panel 10 and the plate 20 to attach the same to each other. Since the plate 20 is rolled at the inner side along a circumference smaller than that of the display panel 10, the greater the number of turns, the greater the difference in path between the plate 20 and the display panel 10 due to the difference in circumference. Therefore, when wound two or more turns around the roller, the plate 20 is pushed a long distance from the display panel 10 at the end of the display unit.

The display unit is wound around the roller in the stored or portable state of the rollable display, and is unwound starting from the end thereof only when used for display. When slippage between the plate 20 and the display panel 10 is severe in the state in which the display unit is wound around the roller, the adhesive layer between the plate 20 and the display panel 10 may be deformed so that the two are fixed in a slipped and deformed state. As a result, when the display unit of the rollable display is unwound from the roller so that an image is displayed on the end of the display unit, a slippage defect occurs. In particular, such slippage occurs not only between the plate 20 and the display panel 10 but also sequentially occurs between respective layers provided in the display panel 10, the adhesive layer, and the plate 20. This is visible as wavy uneven portions when displaying an image, which deteriorates visibility.

SUMMARY

Accordingly, the present disclosure is directed to a rollable display that substantially obviates one or more problems due to limitations and disadvantages of the related art.

The present disclosure has been provided to solve the problems described above, and an object of the present disclosure is to provide a rollable display, which prevents slippage between a display panel and a back plate by varying the shape of the back plate when the back plate is stored in an accommodating case (e.g., housing).

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, the present disclosure provides a rollable display in which a back plate, which serves to support a display panel, is variable in shape so as to be stored in a folded state inside an accommodating case using different characteristics thereof for each area without separate mechanical equipment.

According to one aspect of the present disclosure, a rollable display including a flexible display panel including a first surface as a display surface and a second surface as a rear surface, a back plate disposed in contact with the second surface and including an inner folding portion and an outer folding portion alternately arranged with an unfolding portion therebetween, and an accommodating case including therein an opening, through which the flexible display panel and the back plate are integrally introduced or discharged, and configured to accommodate therein the flexible display panel and the back plate, which are integrally folded at the inner folding portion and the outer folding portion.

The accommodating case may include a space having a height equal to or greater than a sum of a curvature of the inner folding portion, a curvature of the outer folding portion, and a length of the unfolding portion between the inner folding portion and the outer folding portion.

When folded inside the accommodating case, the back plate may be located at an inner side and the first surface of the flexible display panel may be located at an outer side in the inner folding portion, and the back plate may be located at an outer side and the first surface of the flexible display panel may be located at an inner side in the outer folding portion.

Each of the inner folding portion and the outer folding portion of the back plate may have a specific gravity lower than that of the unfolding portion.

Each of the inner folding portion and the outer folding portion of the back plate may include therein a plurality of openings or a plurality of holes. Here, each hole may be larger than ½ of a thickness of the back plate.

The outer folding portion of the back plate may have a width greater than a width of the inner folding portion.

The back plate may further include a step-compensation layer on at least one of an upper surface or a lower surface thereof. The openings or holes may be filled with the step-compensation layer.

The rollable display may further include a capping member provided on one side of the flexible display panel and the back plate, which are integrally introduced or discharged through the opening.

The rollable display may further include a pad member provided on a side of the flexible display panel opposite the one side provided with the capping member.

The rollable display may further include a printed circuit board provided in the accommodating case so as to be electrically connected to a flexible film, which is connected to the pad member.

The pad member may be connected to a flexible printed circuit board.

The flexible printed circuit board may be attached and fixed inside the accommodating case.

The rollable display may further include a support member disposed adjacent to the opening in the accommodating case and serving to support the first surface of the display panel and a surface of the back plate that is not in contact with the second surface.

The back plate may include a plurality of inner folding portions and a plurality of outer folding portions, adjacent inner folding portions, which are spaced apart from each other by one outer folding portion and by unfolding portions at opposite sides thereof outside the accommodating case, may be brought into contact with each other when the back plate is folded in the accommodating case, and adjacent outer folding portions, which are spaced apart from each other by one inner folding portion and by unfolding portions at opposite sides thereof outside the accommodating case, may be brought into contact with each other when the back plate is folded in the accommodating case.

In addition, the rollable display may include a display unit and a link unit, so that the display unit may be folded and unfolded so as to alternately implement inward folding and outward folding multiple times during folding of the link unit.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

DETAILED DESCRIPTION

Figure 1:
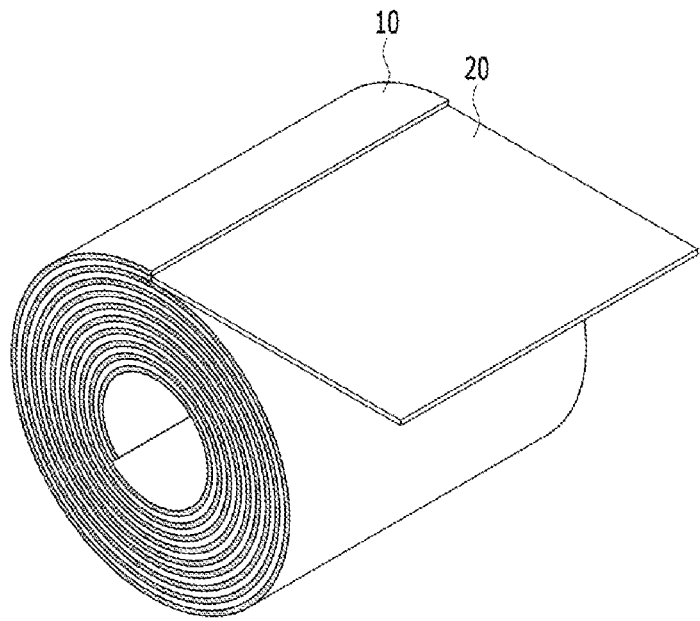
FIG. 1 is a view illustrating a general rollable display.

Hereinafter, exemplary aspects according to the present disclosure will be described in detail with reference to the accompanying drawings. Wherever possible, the same reference numbers will be used throughout the drawings to refer to the same or like parts. In addition, in the following description of the aspects, a detailed description of known functions and configurations incorporated herein will be omitted when it may impede the understanding of the aspects. In addition, the names of constituent elements used in the following description are selected in consideration of ease of writing of the specification, and may differ from names of parts of actual products.

Further, it will be understood that, when an element or a layer is referred to as being "on" another element, it can be directly on the other element or layer or intervening elements or layers may also be present. On the other hand, it will be understood that, when an element or a layer is referred to as being "in contact with" another element, it is directly on the other element without intervening elements or layers therebetween.

In the drawings, the thickness or size of each constituent element is illustrated for clarity and convenience, and the present disclosure is not necessarily limited to the illustrated thickness or size of the constituent element.

Hereinafter, exemplary aspects of the present disclosure will be described with reference to the drawings.

Figure 2:
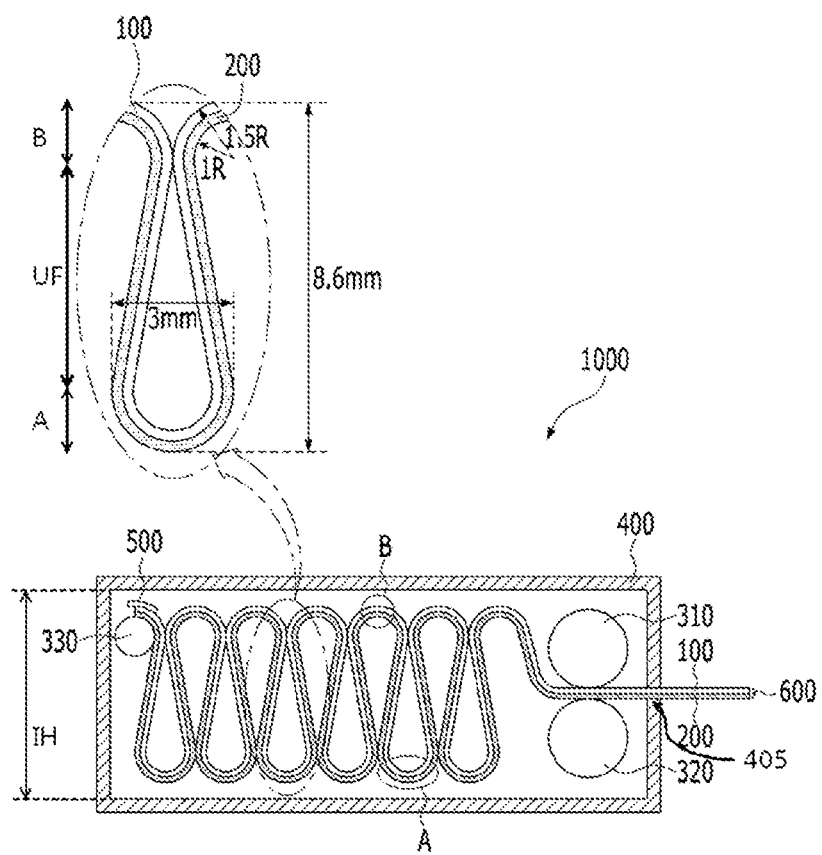
FIG. 2 is a cross-sectional view illustrating the wound state of a rollable display according to a first aspect of the present disclosure.
Figure 3:
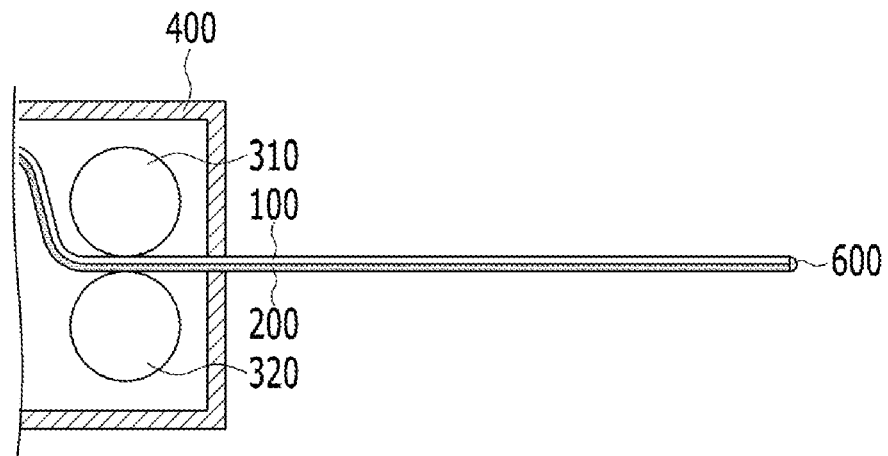
FIG. 3 is a cross-sectional view illustrating the unfolded state of the rollable display of FIG. 2.

FIG. 2 is a cross-sectional view illustrating the wound state of a rollable display according to a first aspect of the present disclosure, and FIG. 3 is a cross-sectional view illustrating the unfolded state of the rollable display of FIG. 2. In addition, FIG. 4 is a perspective view illustrating the rollable display of FIG. 2 inside an accommodating case.

Figure 4:
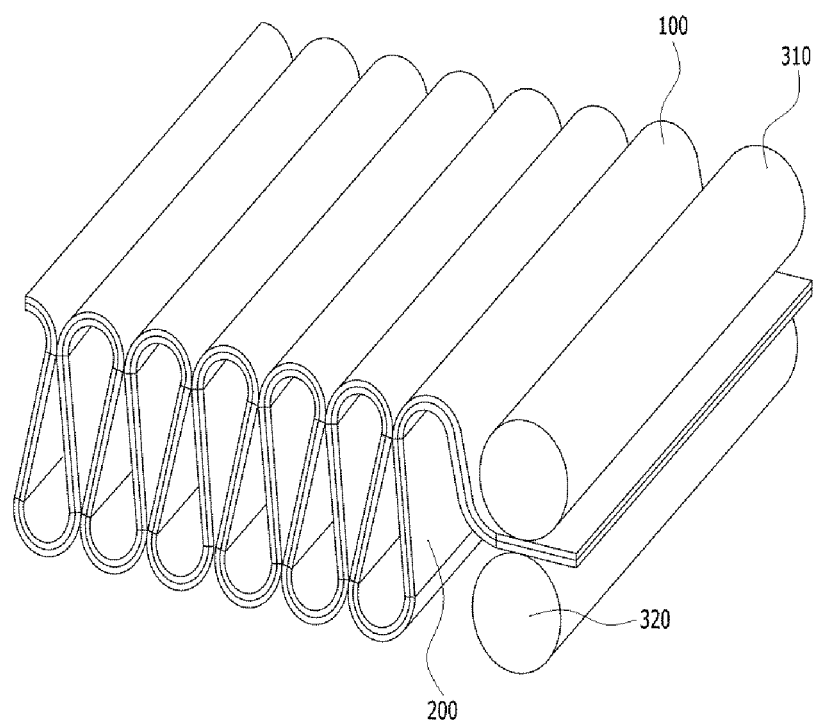
FIG. 4 is a perspective view illustrating the rollable display of FIG. 2 inside an accommodating case.

As illustrated in FIGS. 2 to 4, the rollable display according to the first aspect of the present disclosure, which is designated by reference numeral 1000, includes a flexible display panel 100, which includes a first surface as a display surface and a second surface as a rear surface, a back plate 200, which is in contact with the second surface of the flexible display panel 100 and includes an inner folding portion B and an outer folding portion A alternately arranged with an unfolding portion therebetween, and an accommodating case 400, which has therein an introduction/discharge opening 405, through which the display panel 100 and the back plate 200 are integrally introduced or discharged, and which accommodates therein the display panel 100 and the back plate 200, which are integrally folded at the inner folding portion B and the outer folding portion A.

The flexible display panel 100 serves to display an image. For example, the flexible display panel 100 may use a self-illuminating flexible display panel 100, like an organic light-emitting display panel. In the rollable display of the present disclosure, as illustrated in FIGS. 2 and 3, the flexible display panel 100 is repeatedly wound and unwound together with the back plate 200, and displays an image in the unwound state thereof. The back plate 200 may implement folding when accommodated inside the accommodating case 400 owing to different shapes thereof for each area, without a separate member. The flexible display panel 100 may be sufficiently thin, and may have a modulus lower than that of a major material of the back plate 200 so as to implement folding together with the back plate 200.

Considering the external appearance of the rollable display, the accommodating case 400, the first surface of the flexible display panel 100, which protrudes from the accommodating case 400 to display an image thereon, the rear surface of the back plate 200 (which is a surface opposite the flexible display panel 100) attached to the second surface of the flexible display panel 100, and a capping member 600, which is provided on one side of the display panel 100 and the back plate 200 to perform an encapsulation function, are visible. The capping member 600 is formed of silicon, epoxy, acrylic resin, or the like.

The flexible display panel 100 and the back plate 200 have a substantially rectangular shape when unfolded, without being limited thereto. Alternatively, the flexible display panel 100 and the back plate 200 may be modified to have four rounded corners, or may be modified to have a polygonal or circular shape, other than the rectangular shape.

The back plate 200 is formed of a stainless steel plate, and one surface thereof faces the lower surface of the flexible display panel 100. That is, the facing surfaces of the flexible display panel 100 and the back plate 200 are aligned with each other, so that the flexible display panel 100 and the back plate 200 are integrally folded inside the accommodating case 400, and are integrally unfolded outside the accommodating case 400. An adhesive layer (not illustrated) may be provided between the flexible display panel 100 and the back plate 200. Since the flexible display panel 100 and the back plate 200 integrally implement winding and unwinding inside and outside the accommodating case 400, the adhesive layer may be evenly provided on the second surface of the flexible display panel 100.

Referring to FIG. 2, the accommodating case 400 may have a space having a height IH equal to or greater than the sum of the curvature (1.5R) of the inner folding portion B, the curvature (1.5R) of the outer folding portion A, and the length of the unfolding portion UF between the inner folding portion B and the outer folding portion A. That is, when the accommodating case 400 has a height "3R+h", which is the smallest inner thickness, the inner folding portion B and the outer folding portion A may come into contact with the inner surface of the accommodating case 400. In addition, in order to reduce the longitudinal length (in the X direction) of the accommodating case 400, the rollable display of the present disclosure is configured, for example, in a manner such that adjacent areas of the back plate 200 at the outer folding portion A are in contact with each other and adjacent areas of the flexible display panel 100 at the inner folding portion B are in contact with each other.

The curvature illustrated in FIG. 2 is an example, and is not limited thereto. The curvature may be set to be larger or smaller than this, and may be controlled depending on the height of the accommodating case 400.

The back plate 200 may include a plurality of inner folding portions B and a plurality of outer folding portions A. Adjacent inner folding portions B, which are spaced apart from each other by one outer folding portion A and unfolding portions UF at opposite sides thereof outside the accommodating case 400, may be brought into contact with each other when the back plate 200 is folded in the accommodating case 400. Adjacent outer folding portions A, which are spaced apart from each other by one inner folding portion B and unfolding portions UF at opposite sides thereof outside the accommodating case 400, may be brought into contact with each other when the back plate 200 is folded inside the accommodating case 400.

When folded inside the accommodating case 400, the back plate 200 is located at the inner side and the first surface of the flexible display panel 100 is located at the outer side in the inner folding portion B, whereas the back plate 200 is located at the outer side and the first surface of the flexible display panel 100 is located at the inner side in the outer folding portion A.

Each of the inner folding portion B and the outer folding portion A of the back plate 200 may have a specific gravity lower than that of the unfolding portion UF.

To this end, the back plate 200 is variable to any of various shapes, and the rollable display of the present disclosure has a feature in that the inner folding portion B or the outer folding portion A has an opening or a hole that is formed in a part of the thickness thereof, unlike the unfolding portion UF. A description thereof will be made below.

Figure 5:
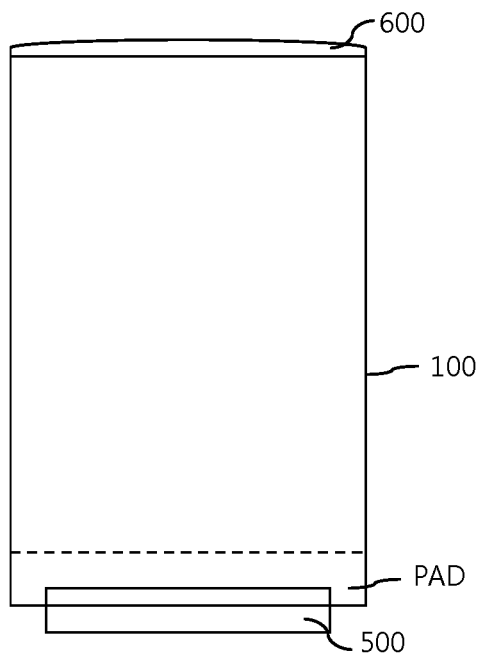
FIG. 5 is a plan view illustrating a flexible display panel of FIG. 2 alone.

The flexible display panel 100 may include a pad member (not illustrated) on the side thereof opposite the side thereof provided with the capping member 600 (shown as "PAD" in FIG. 5).

Alternatively, the pad member PAD of the flexible display panel 100 may be connected to a flexible film such as a COF, and a printed circuit board 500 may further be provided inside the accommodating case 400 so as to be electrically connected to the flexible film. Here, the printed circuit board 500 may be attached and fixed to the inner side portion or the inner lower surface of the accommodating case 400. In this case, the printed circuit board 500 takes the form of a hard board, and an electrical signal is transmitted from the printed circuit board 500 to the pad member PAD through a wire provided in the flexible film.

Alternatively, as illustrated in FIG. 2, the pad member PAD of the flexible display panel 100 and the flexible printed circuit board 500 may be directly connected to each other. Here, the other side portion of the flexible display panel 100, on which the flexible printed circuit board 500 is located, may be fixed in the accommodating case 400 using a fixing member 330.

As illustrated, support members 310 and 320 may further be provided adjacent to the introduction/discharge opening 405 in the accommodating case 400 to support the first surface of the flexible display panel 100 and the surface of the back plate 200 opposite the second surface of the flexible display panel 100. The support members 310 and 320 may push the flexible display panel 100 and the back plate 200 so as to allow the two to smoothly move out through the introduction/discharge opening 405.

Figure 6:
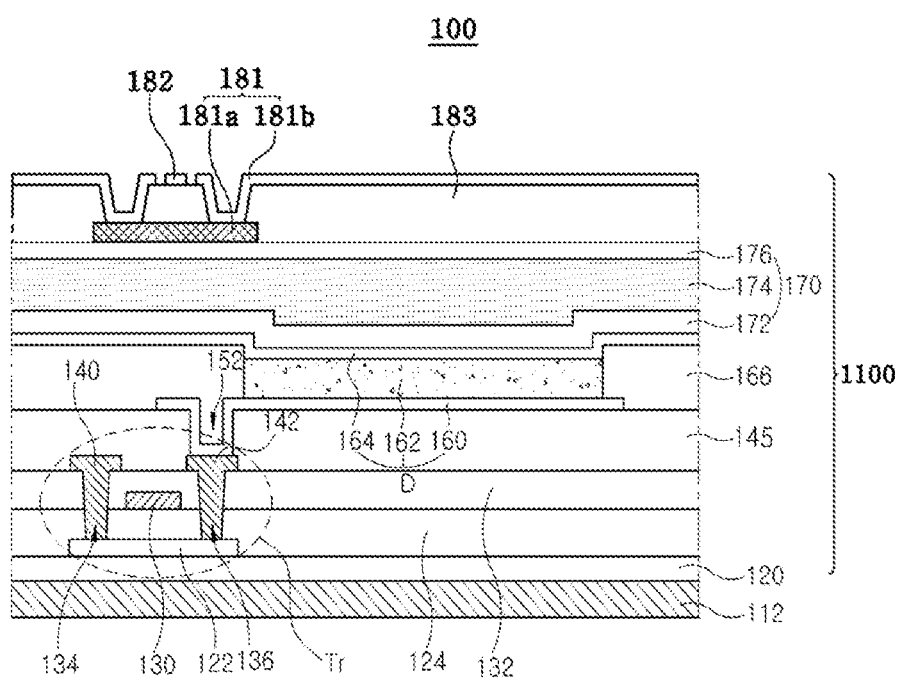
FIG. 6 is a cross-sectional view illustrating the flexible display panel according to the present disclosure.

FIG. 5 is a plan view illustrating the flexible display panel of FIG. 2 alone, and FIG. 6 is a cross-sectional view illustrating the flexible display panel according to the present disclosure.

In FIG. 5, it is conceivable that the flexible display panel 100 moves out through the introduction/discharge opening in the vertical direction. Here, the capping member 600 is provided on one side of the flexible display panel 100, and the pad member PAD is provided on the other side of the flexible display panel 100. The pad member PAD of the flexible display panel 100 may be directly connected to the printed circuit board 500, or may be connected to the printed circuit board 500 with the flexible film, such as a COF, interposed therebetween, as described above. As illustrated in FIG. 2, the printed circuit board 500 is fixed to the back plate 200 and to the flexible display panel 100 using the fixing member 330. In some cases, when the printed circuit board 500 is connected to the pad member PAD with the flexible film interposed therebetween, the printed circuit board 500 may be formed of a hard material so as to be fixed to the inner side portion or the inner lower surface of the accommodating case 400, or may be configured with a flexible printed circuit board using a flexible material.

The flexible display panel 100 independently implements display, and in order to maintain flexibility, a flexible base material (shown as 112 in FIG. 5) thereof, on which, for example, a thin-film transistor array is disposed, may be formed of a flexible plastic film or organic material. The flexible base material 112 has an approximate thickness ranging from 3 μm to 100 μm, and the overall approximate thickness of the flexible display panel 100 ranges from 5 μm to 300 μm even when it includes the array formed on the flexible base material 112, so that the display panel 100 may be folded by folding or bending any region thereof. However, in the rollable display as a finished product, a folding region FR may be set to a specific region depending on the device requirements. The folding region FR may be specified as having different configurations for each area depending on the requirements of any other constituent element, i.e. the back plate 200, excluding the display panel 100. In some cases, in order to secure sufficient flexibility during a folding operation and to prevent damage to the array, the flexible display panel 100 may include the flexible base material 112, which has different array shapes or different surface structures in the folding region FR and the unfolding region UFR.

As illustrated in FIG. 6, a buffer layer 120 is formed on a flexible substrate (the flexible base material 112), and a thin-film transistor Tr is formed on the buffer layer 120. The buffer layer 120 may be omitted.

A semiconductor layer 122 is formed on the buffer layer 120. The semiconductor layer 122 may be formed of an oxide semiconductor material or polycrystalline silicon.

When the semiconductor layer 122 is formed of an oxide semiconductor material, a light-blocking pattern (not illustrated) may be formed below the semiconductor layer 122. The light-blocking pattern prevents light from being incident on the semiconductor layer 122, thereby preventing the semiconductor layer 122 from being deteriorated by light. Unlike this, the semiconductor layer 122 may be formed of polycrystalline silicon, in which case opposite edges of the semiconductor layer 122 may be doped with a dopant.

A gate insulation layer 124 is formed on the semiconductor layer 122 using an insulating material. The gate insulation layer 124 may be formed of an inorganic insulating material such as silicon oxide or silicon nitride.

A gate electrode 130 is formed on the gate insulation layer 124 using a conductive material such as a metal so as to correspond to the center of the semiconductor layer 122.

Although the gate insulation layer 124 is illustrated as being formed over the entire surface of the flexible base material 112 in FIG. 6, the gate insulation layer 124 may alternatively be patterned to have the same shape as the gate electrode 130.

An interlayer insulation film 132 is formed on the gate electrode 130 using an insulating material. The interlayer insulation film 132 may be formed of an inorganic insulating material such as silicon oxide or silicon nitride, or may be formed of an organic insulating material such as benzocyclobutene or photo-acryl.

The interlayer insulation film 132 has therein first and second contact holes 134 and 136, which expose opposite sides of the semiconductor layer 122. The first and second contact holes 134 and 136 are located at opposite sides of the gate electrode 130 so as to be spaced apart from the gate electrode 130.

Here, the first and second contact holes 134 and 136 are also formed in the gate insulation layer 124. Unlike this, when the gate insulation layer 124 is patterned to have the same shape as the gate electrode 130, the first and second contact holes 134 and 136 may be formed only in the interlayer insulation film 132.

A source electrode 140 and a drain electrode 142 are formed on the interlayer insulation film 132 using a conductive material such as a metal.

The source electrode 140 and the drain electrode 142 are located so as to be equidistantly spaced apart from the gate electrode 130, and are brought into contact with opposite sides of the semiconductor layer 122 through the first and second contact holes 134 and 136, respectively.

The semiconductor layer 122, the gate electrode 130, the source electrode 140, and the drain electrode 142 constitute the thin-film transistor Tr, and the thin-film transistor Tr functions as a driving element.

The thin-film transistor Tr may have a coplanar structure in which the gate electrode 130, the source electrode 142, and the drain electrode 144 are located on the semiconductor layer 120.

Unlike this, the thin-film transistor Tr may have an inverted staggered structure in which the gate electrode is located below the semiconductor layer and the source electrode and the drain electrode are located above the semiconductor layer. In this case, the semiconductor layer may be formed of amorphous silicon.

Although not illustrated, a gate line and a data line cross each other to define a pixel area, and a switching element is further formed so as to be connected to the gate line and the data line. The switching element is connected to the thin-film transistor Tr, which serves as the driving element.

In addition, a power line may be spaced apart from and parallel to the gate line or the data line, and a storage capacitor may further be provided in order to allow the gate electrode of the thin-film transistor Tr, serving as the driving element, to maintain a constant voltage during one frame.

A protective layer 145, which has therein a drain contact hole 152 for exposing the drain electrode 142 of the thin-film transistor Tr, is formed so as to cover the thin-film transistor Tr. Thin-film transistors Tr having the same shape described above are provided in respective pixel areas, and the thin-film transistors Tr provided on the flexible base material 112 are collectively referred to as a thin-film transistor array.

A first electrode 160 is discretely formed on the protective layer 145 for each pixel area so as to be connected to the drain electrode 142 of the thin-film transistor Tr through the drain contact hole 152. The first electrode 160 may be an anode, and may be formed of a conductive material having a relatively large work function value. For example, the first electrode 160 may be formed of a transparent conductive material, such as indium-tin-oxide (ITO) and indium-zinc-oxide (IZO), or may be configured with a multilayered electrode including at least one layer of transparent conductive material.

In the case in which the display panel 100 of the present disclosure is of a top-emission type, a reflective electrode or a reflective layer may further be formed below the first electrode 160. For example, the reflective electrode or the reflective layer may be formed of an aluminum-palladium-copper (APC) alloy. In some cases, a transparent conductive material may further be provided below the reflective electrode.

In addition, a bank layer 166 is formed on the protective layer 145 so as to cover the edge of the first electrode 160. The bank layer 166 corresponds to the pixel area and exposes the center of the first electrode 160.

An organic emission layer 162 is formed on the first electrode 160. The organic emission layer 162 may take the form of a single layer formed of a light-emitting material. In addition, in order to increase luminous efficacy, the organic emission layer 162 may have a multilayered structure including a hole injection layer, a hole transport layer, a light-emitting material layer, an electron transport layer, and an electron injection layer, which are sequentially stacked on the first electrode 160.

A second electrode 164 is formed on the organic emission layer 162 above the flexible base material 112. The second electrode 164 may be located over the entirety of a display area, and may be a cathode formed of a conductive material having a relatively small work function value. For example, the second electrode 164 may be formed of any one of aluminum (Al), magnesium (Mg), silver (Ag), ytterbium (Yb), an aluminum alloy, for example AlMg, and silver alloy, for example, AgMg.

The first electrode 160, the organic emission layer 162, and the second electrode 164 constitute an organic light-emitting diode D. The organic light-emitting diode D is provided in each pixel area so as to be connected to the thin-film transistor Tr, and organic light-emitting diodes formed in all of the pixel areas are also collectively referred to as an organic light-emitting diode.

An encapsulation film 170 is formed on the second electrode 164 in order to prevent external moisture from entering the organic light-emitting diode D. The encapsulation film 170 may take the form of a stack including a first inorganic insulation layer 172, an organic insulation layer 174, and a second inorganic insulation layer 176, but is not limited thereto as long as it is formed by alternately stacking an inorganic insulation layer and an organic insulation layer so that the outermost layer is an inorganic insulation layer.

In addition, a touch electrode array including a first touch electrode 181 and a second touch electrode 182 may further be provided on the encapsulation film 170 in order to detect a touch. In the illustrated form, a bridge line 181a is provided on the second inorganic insulation layer 176, which is the outermost layer, a touch insulation layer 183 is provided on the bridge line 181a, and a first touch pattern 181b and the second touch electrode 182 are spaced apart from each other on the touch insulation layer 183. Here, the first touch pattern 181b is electrically connected to the bridge line 181a through a contact hole in the touch insulation layer 183 so as to configure the first touch electrode 181. In the drawing, only a portion of the second touch electrode 182 is illustrated. The second touch electrode 182 is located on a portion of the touch insulation layer 183 in which the first touch pattern 181b is not located, and generates mutual capacitance Cm between first and second touch patterns 181b that are spaced apart from each other.

The presence or absence of a touch may be detected based on variation in mutual capacitance Cm.

The illustrated touch electrode array is given by way of example, and the disclosure is not limited thereto. Although the touch electrode array may be directly formed on the encapsulation film 170, as illustrated, a separate material or insulation layer may further be provided so that the touch electrode array is disposed thereon, or the touch electrode array may be provided inside a cover film. In some cases, the encapsulation film 170 may be located on the top of the display panel 100 without providing the touch electrode array.

A polarizer (not illustrated) may be attached on the touch electrode array in order to reduce the reflection of external light. For example, the polarizer may be a circular polarizer. Alternatively, a cover layer such as a cover window may further be provided in order to protect the top of the touch electrode array.

Reference numeral "1100", not described above, denotes an array structure including all of an array of the thin-film transistors Tr formed on the flexible base material 112, an array of the organic light-emitting diodes D connected to the respective thin-film transistors Tr, the encapsulation layer 170 covering the aforementioned constituents, and a touch electrode array 181, 182 and 183.

The display panel described above is given by way of example, and is an organic light-emitting display panel, but may be replaced with any other type of display panel as long as it is flexible. For example, the organic light-emitting display panel described above may be replaced with a flexible liquid-crystal panel, a flexible quantum-dot display panel, or a flexible electrophoretic display panel.

In the rollable display of the present disclosure, as described above with reference to FIGS. 2 to 4, the flexible display panel 100 and the back plate 200 are integrally rolled inside the accommodating case 400 in the state in which they are bonded to face each other. Considering the shape of the rollable display, an inward folding structure in which the back plate 200 is rolled inwards, a predetermined unfolding structure, an outward folding structure in which the back plate 200 is rolled outwards, and the unfolding structure are repeatedly deployed. In this case, the flexible display panel 100 implements inward folding and outward folding in the inverted shape of inward folding and outward folding of the back plate 200. In this case, such inward folding and outward folding are obtained by different shapes of the back plate 200 for each area, without a separate member. That is, as illustrated in FIG. 3, when a display unit of the flexible display panel 100 and the back plate 200, which are integrally unfolded, is introduced into the limited space in the accommodating case 400, as illustrated in FIG. 2, a specific area of the back plate 200 is rolled inwards or outwards due to different patterns of the back plate 200 for each area, and the remaining area remains unfolded. In this case, inward folding and outward folding are repeated to compensate for each other, so that no slippage occurs between the flexible display panel 100 and the back plate 200.

Figure 7A:
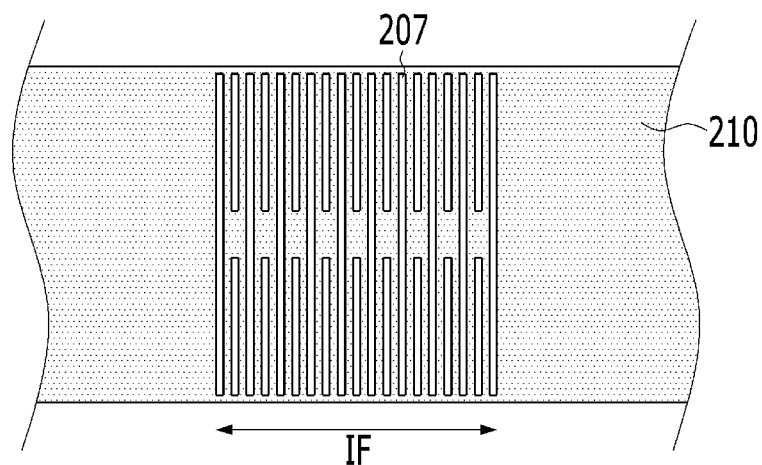
FIGS. 7A and 7B are plan views illustrating areas B and A of FIG. 2.
Figure 7B:
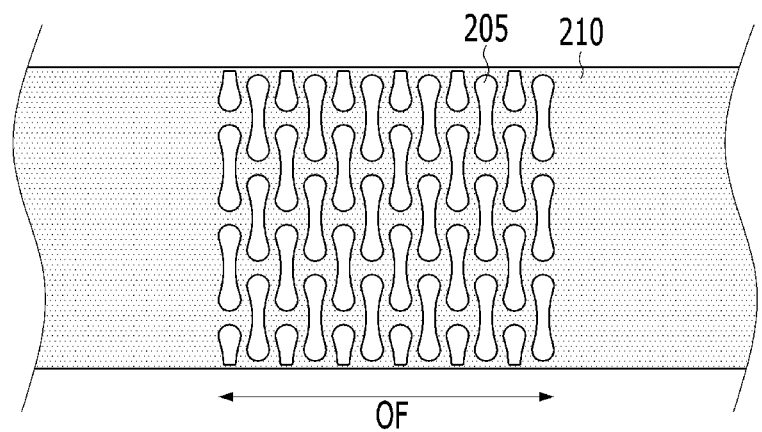

FIGS. 7A and 7B are plan views illustrating areas B and A of FIG. 2.

FIG. 7A illustrates the inner folding portion B. An unfolding portion 210 remains in a plate state, but a plurality of openings or holes 207 for inward folding are formed in the inner folding portion B.

Referring to FIG. 7A, a single opening or hole is formed in a first pattern in an odd-numbered column, and two openings or holes are formed in a second pattern in an even-numbered column. However, the first pattern may include two or more openings or holes, and the second pattern may include three or more openings or holes.

Each of the first and second patterns is configured so as to extend in the column direction. That is, the major axis of each of the first and second patterns may be parallel to the column direction.

Accordingly, the inner folding portion, in which the openings 207 are formed, serves as a spring to increase the elastic restoration energy of the back plate 200 during repeated folding and unfolding operations. Thus, when the rollable display is again changed to an unfolded state so that folding stress is removed, the time taken until the rollable display returns to the original state thereof may be reduced.

The openings 207 in the patterns may be modified to a polygonal or elliptical shape that is elongated in the folding axis direction, or may be modified to a polygonal shape having respective rounded corners.

The opening patterns including the openings 207, as illustrated in FIG. 7A, may include pairs of first and second patterns having the same shape, and may be repeated in the entire inner folding portion IF. Alternatively, the opening patterns having the same shape may be gradually densely or loosely arranged from the center to the edge of the inner folding portion IF. In some cases, random opening patterns may be provided merely to differentiate the inner folding portion IF from the unfolding portion 210. The first and second patterns may be disposed so that the longitudinal direction thereof coincides with the folding axis direction. That is, the openings 207 may be elongated in the folding axis direction.

The back plate 200 is located below the flexible display panel 100 and supports the display panel 100. The back plate 200 has stiffness greater than the flexible base material 112. That is, the back plate 200 may have a Young's modulus greater than that of the flexible base material 112.

For example, the back plate 200 may be formed of a high-stiffness material such as stainless steel, and therefore, may have higher restoring force and greater stiffness than other materials, which may cause a reduction in the thickness of the back plate 200.

That is, when the back plate 200 is formed of a high-stiffness material such as stainless steel, the back plate 200 may maintain desired stiffness even if the thickness thereof is reduced, thereby serving to support the flexible display panel 100. In addition, such a reduction in thickness may reduce plastic deformation of the back plate 200.

However, the back plate 200, which is formed of a high-stiffness material and has a small thickness, is very difficult to restore once it has been deformed because of the narrow elastic deformation range thereof. That is, the back plate 200 may not be unfolded after being folded, and the time during which the folded shape is maintained is increased.

Although the shape in which a long rectangle and a short rectangle are alternately repeated is illustrated, the shape of the opening patterns is not limited thereto, and rectangles having the same shape may be repeated. In addition, the shape of the openings or holes 207 is not limited to a rectangular shape, and may be any of a circular shape, other polygonal shapes, an elliptical shape, or variations thereof.

FIG. 7B illustrates the outer folding portion A (OF). The unfolding portion 210 (UF) remains in a plate shape, but a plurality of openings or holes 205 for outward folding are formed in the outer folding portion OF. The openings or holes 205 are illustrated as being formed to have a dumbbell shape in plan, but are not limited thereto, and may be modified in various ways, as in the above-described inner folding portion B (IF).

It is to be noted that the inner folding portion B and the outer folding portion A occupy different lengths of areas of the back plate 200, so that the area occupied by the openings or holes 205 in the outer folding portion OF is wider than the area occupied by the openings or holes 207 in the inner folding portion IF.

Here, the openings or holes 207 for inward folding function to reduce the specific gravity of the area, in which folding occurs, compared to the unfolding portion 210 having a relatively large modulus, thereby causing the area to serve as a spring. Although the back plate 200, used in the rollable display of the present disclosure, may be formed of a high-stiffness material so as to support the flexible display panel 100 even with a small thickness ranging from 2 mm to 3 mm, when the back plate 200 is formed of only such a high-stiffness material, it may have difficulty in returning to the original state thereof after external force is applied thereto. To prevent this, as illustrated in FIGS. 7A and 7B, the openings or holes 207 and 205 are formed in the inner folding portion and the outer folding portion so as to increase the restoring force of the back plate 200. That is, it is possible to provide a back plate 200 having a small thickness and high restoring force.

FIGS. 7A and 7B illustrate the openings or holes 207 for inward folding and the openings or holes 205 for outward folding according to one example, and the openings or holes 207 and 205 may have the same shape, but may be formed in the areas IF and OF having different widths due to the difference in area (i.e., path).

Figure 8:
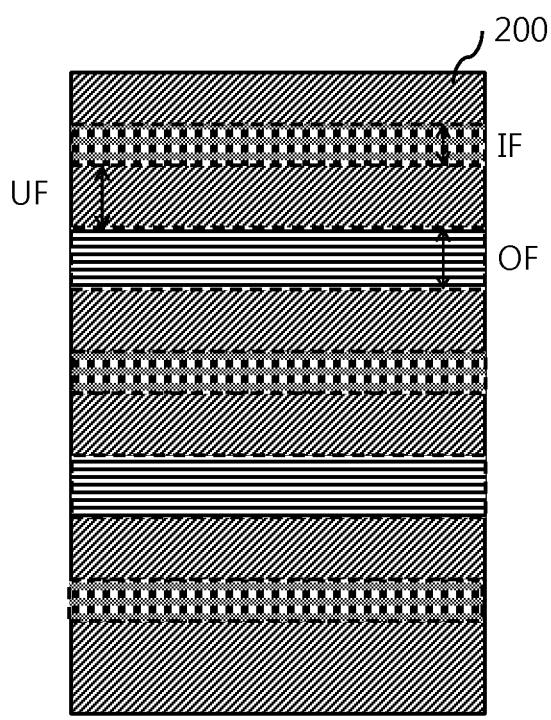
FIG. 8 is a plan view illustrating a back plate of FIG. 2.

FIG. 8 is a plan view illustrating the back plate of FIG. 2, and FIGS. 9A to 9F are cross-sectional views of area A or area B of the back plate illustrated in FIG. 2 according to various aspects.

The material of the back plate 200 in the rollable display of the present disclosure is a ferrous alloy having stiffness, such as stainless steel, in which an alloy element excluding steel is 50% or less and the content of chrome (Cr) therein ranges from 7% to 32%. In addition to the steel and chrome, the back plate 200 may further include a metal such as nickel and a non-metal material such as silicon (Si).

As illustrated in FIG. 8, since the back plate 200 needs to repeatedly implement inward folding and outward folding, the inner folding portion IF, in which the openings or holes for inward folding are formed, and the outer folding portion OF, in which the openings or holes for outward folding are formed, are alternately repeated with the unfolding portion UF (which includes no opening or hole and is formed of stainless steel) interposed therebetween.

Considering the cross-sectional configuration in detail, different first and second patterns, which have the planar shape illustrated in FIG. 7A described above, are respectively designated by 202*a* and 202*b*.

FIGS. 9A to 9F are cross-sectional views illustrating openings or holes, which may be applied to the inner folding portion IF or the outer folding portion OF of the back plate 200. The openings or holes may have the same cross-sectional shape, and thus are designated by the same reference numeral "202".

The openings 202, which include the first pattern 202a formed in the $(2n-1)^{st}$ column and the second patterns 202b formed in the $(2n)^{th}$ column, is formed (here, "n" is a positive integer).

Each of the first and second patterns 202a and 202b may have a rectangular shape. In addition, the space between the second patterns 202b formed in the $(2n)^{th}$ columns may correspond to the first pattern 202a formed in the $(2n-1)^{st}$ column.

In the back plate 200, as illustrated in FIGS. 9A and 9C to 9F, in order to prevent an area including the openings 202 from being stepped and to protect the back plate 200, first and second step-compensation layers 211 and 213 may be formed on the lower surface and the upper surface of the back plate 200. Here, the step-compensation layers 211 and 213 are formed of a material having stiffness lower than that of a body 200a of the back plate 200. For example, each of the first and second step-compensation layers 211 and 213 may be formed of one of polyurethane (PU), thermoplastic polyurethane (TPU), polyacrylate, rubber, and silicon (Si).

In this case, the first and second step-compensation layers 211 and 213 cover the openings 202 to protect the same and eliminate any stepped portion. Through the provision of the first and second step-compensation layers 211 and 213, it is possible to prevent any display defect that may be caused by the openings 202.

Any one of the first and second step-compensation layers 211 and 213 may be formed, and may be selectively formed only in the folding region FR.

Figure 9A:
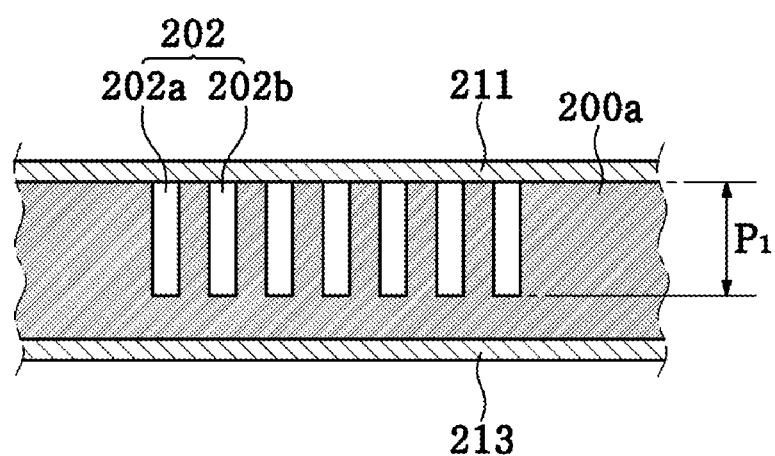
FIGS. 9A to 9F are cross-sectional views of area A or area B of the back plate illustrated in FIG. 2 according to various aspects.
Figure 9B:
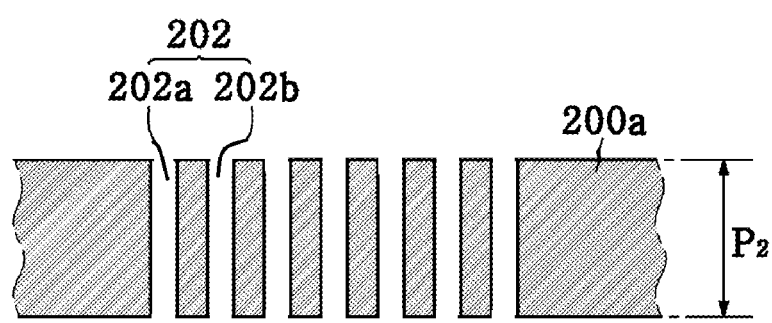
Figure 9C:
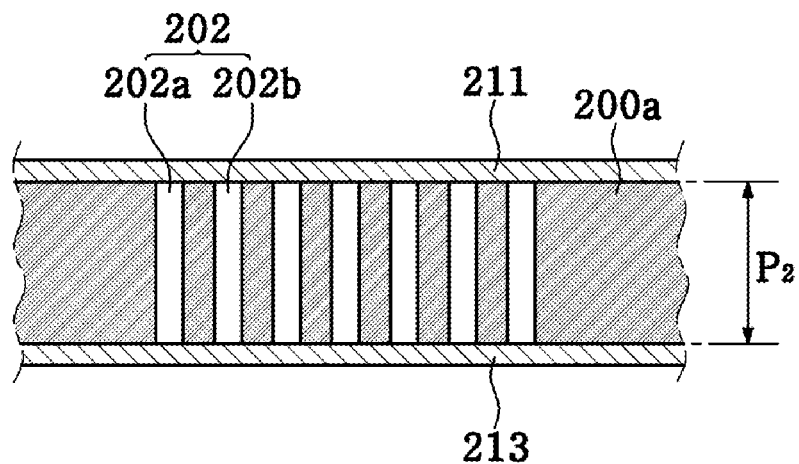
Figure 9D:
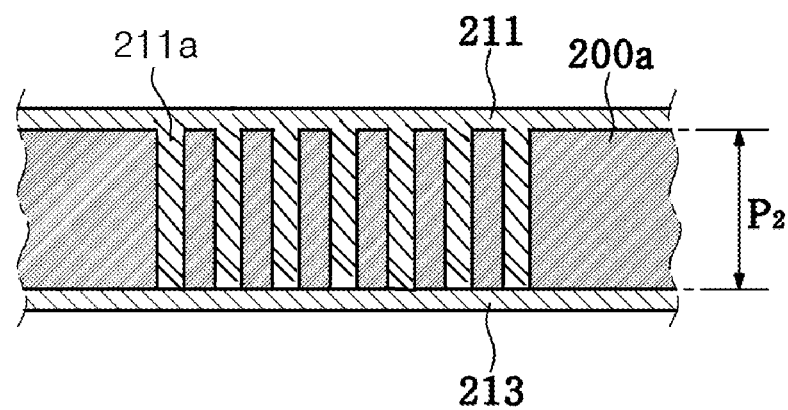

In some cases, as illustrated in FIG. 9D, one of the first and second step-compensation layers 211 and 213 may be formed so as to fill the openings 202. Here, a step-compensation layer 211a, which fills the openings 202 in the inner folding portion IF or the outer folding portion OF, may have stiffness lower than that of the back plate 200 formed of stainless steel, and thus may remain reliable even during repeated folding operations of the folding region FR.

Here, FIG. 9B illustrates the most basic configuration of the back plate 200, which includes the inner folding portion IF and the outer folding portion OF, but includes no step-compensation layer so that the openings 202 (202a and 202b) are exposed from the surface thereof. When the back plate 200 having the cross-sectional structure illustrated in FIG. 9B is disposed so as to face the flexible display panel 100, an adhesive layer therebetween may fill the openings 202 to perform attachment between the back plate 200 and the flexible display panel 100.

Figure 9E:
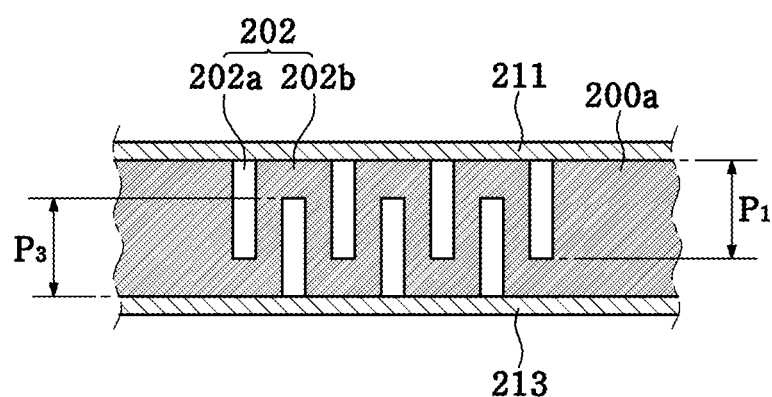
Figure 9F:
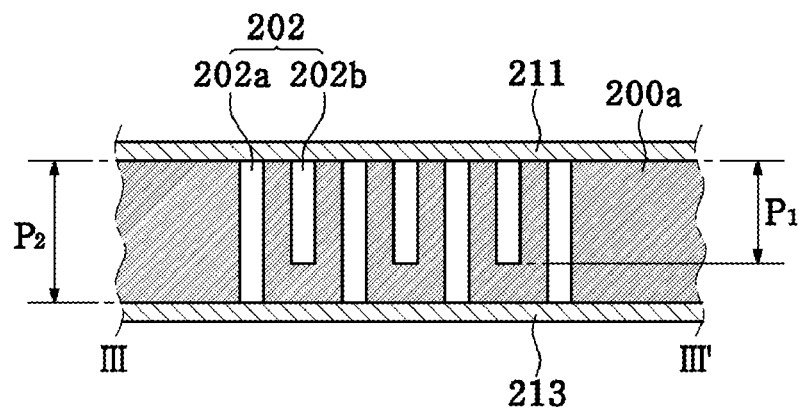

The openings 202 may have a length equal to a partial thickness P1 of the body 200, as illustrated in FIG. 9A, or may have a length equal to the entire thickness P2 of the body 200a, as illustrated in FIG. 9B or 9C. As illustrated in FIG. 9E, the openings 202, which have a length equal to a partial thickness P1 or P3, may be alternately located in the upper surface and the lower surface of the body 200a. As illustrated in FIG. 9F, the opening 202, which has a length equal to the partial thickness P1 of the body 200a, and the opening 202, which has a length equal to the entire thickness P2 of the body 200a, may be alternately located.

When the openings 202 of FIG. 9E or 9F are formed to have a length equal to the partial thickness P1, the thickness P1 needs to be greater than ½ of the thickness of the body 200a, which may be desirable in terms of stretching and contraction of the openings 202.

As described above, the rollable display of the present disclosure includes the high-stiffness back plate 200 to support the display panel 100, and the back plate 200 is configured to have different patterns in the inner folding portion, the outer folding portion, and the unfolding portion therebetween, which may cause the outer folding portion and the inner folding portion to compensate for each other. Thereby, it is possible to prevent slippage between the back plate and the flexible display panel, and consequently to improve visibility.

In particular, the rollable display of the present disclosure is configured to repeatedly implement tension and compression, which may prevent slippage of the rollable display that is wound in a given direction, and waviness in display due thereto.

In the rollable display of the present disclosure, the inner folding portion, the outer folding portion, and the unfolding portion therebetween configure one set, and a plurality of sets thereof is provided inside the accommodating case. With this configuration, the display surface of the rollable display may be expanded in the fully unfolded state thereof, which results in higher efficiency of utilization of the display surface for a given area of the accommodating case.

In addition, the rollable display of the present disclosure enables automatic inward folding and outward folding of the back plate inside the accommodating case owing to the formation of differentiated patterns of the back plate without a specific mechanical member.

Figure 10:
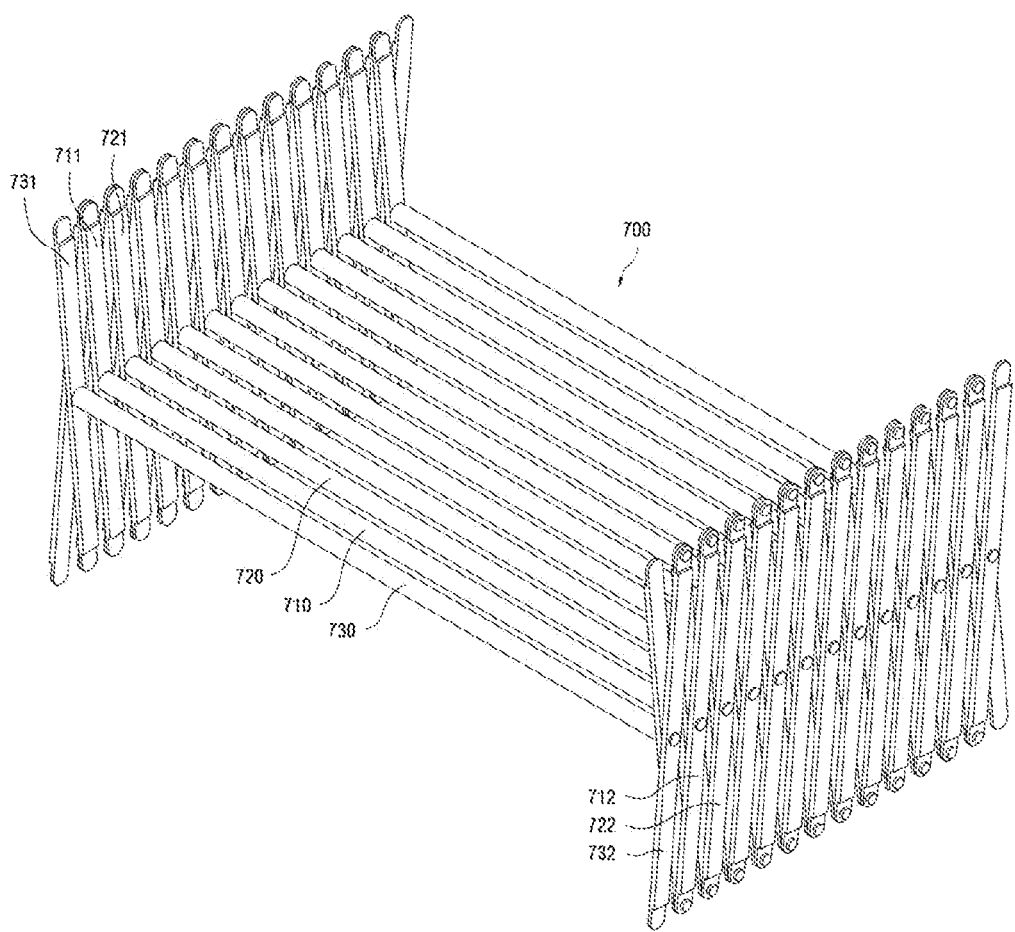
FIG. 10 is a perspective view illustrating a rollable display according to a second aspect of the present disclosure.
Figure 11:
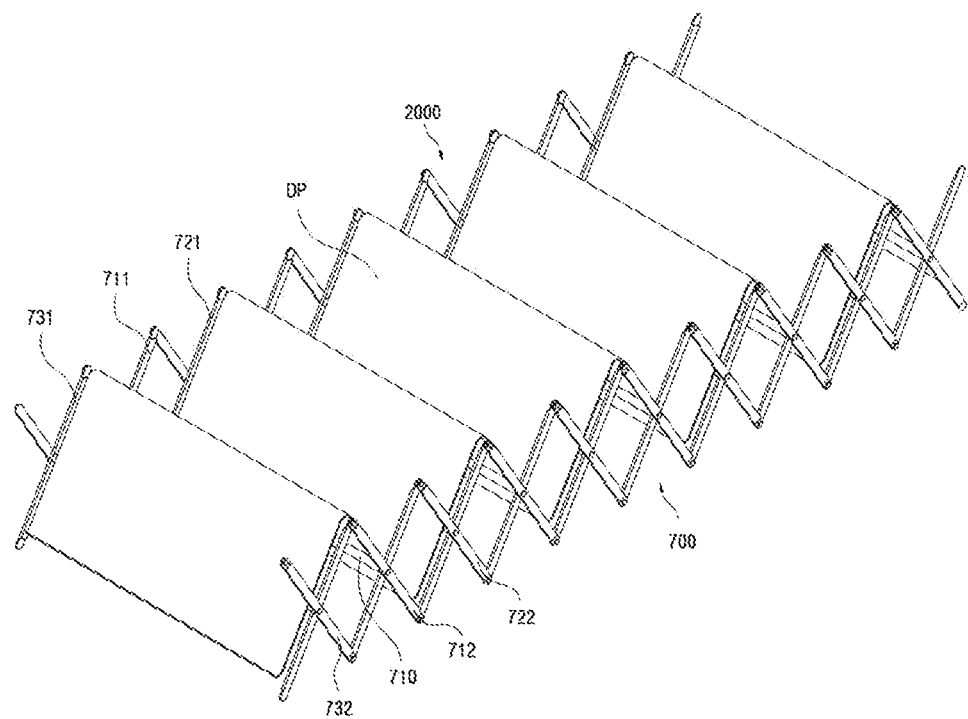
FIGS. 11 to 13 are reference views illustrating the state in which the rollable display of FIG. 10 is gradually unfolded.
Figure 12:
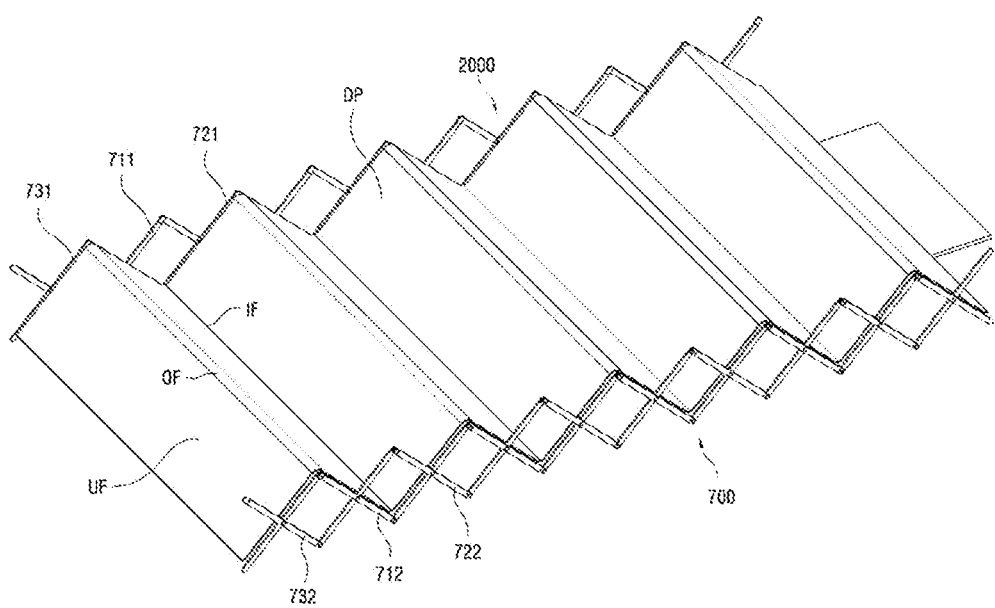
Figure 13:
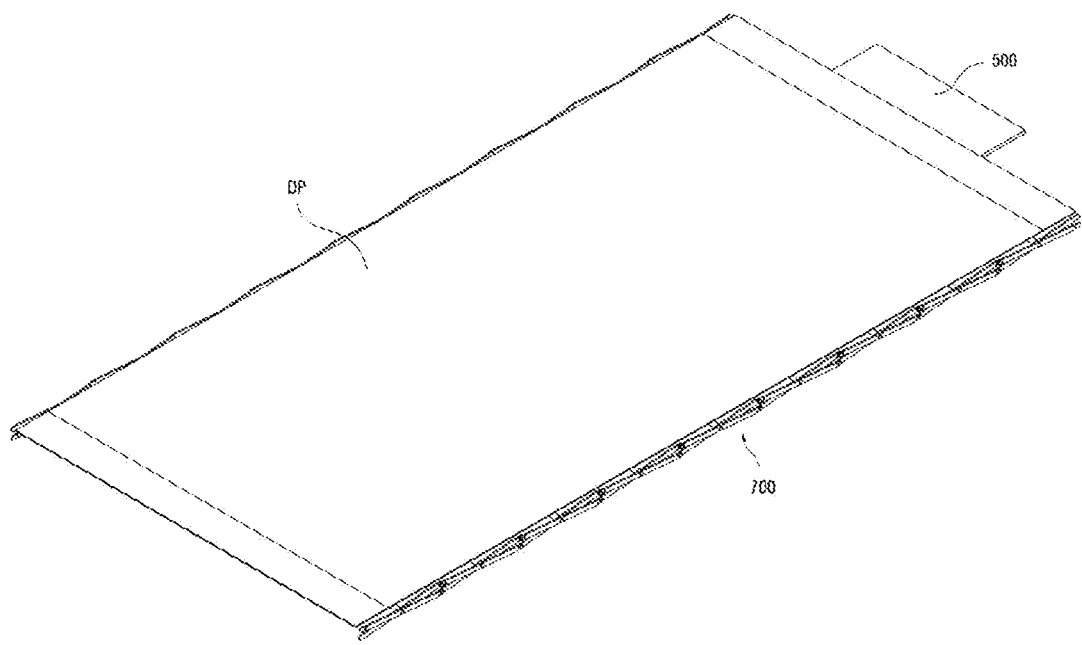
Figure 14A:
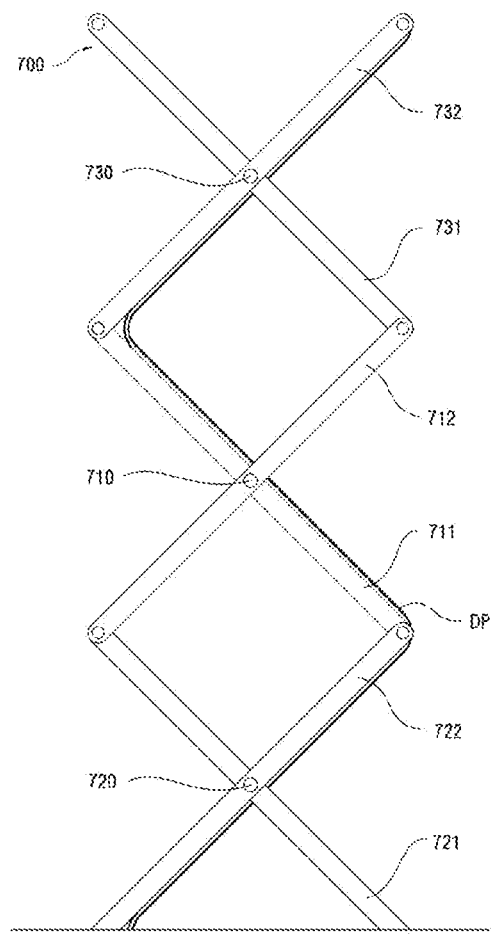
FIG. 14A is a side view illustrating the side surface of FIG. 12.
Figure 14B:
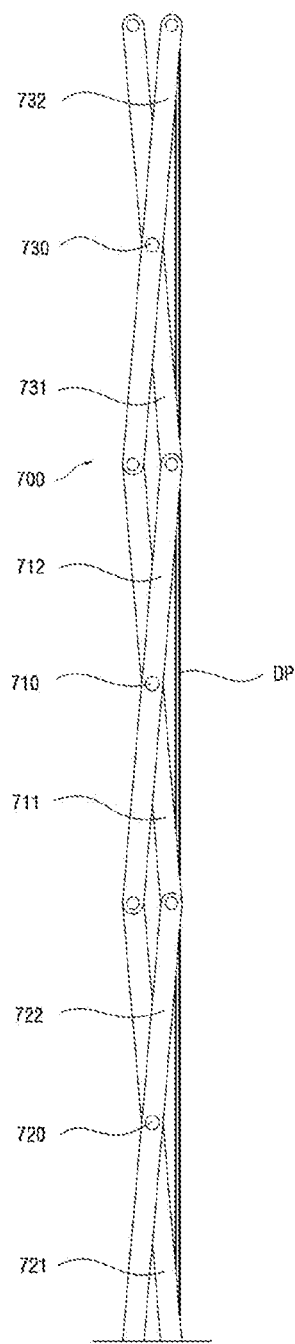
FIG. 14B is a side view illustrating the side surface of FIG. 13.

FIG. 10 is a perspective view illustrating a rollable display according to a second aspect of the present disclosure, FIGS. 11 to 13 are reference views illustrating the state in which the rollable display of FIG. 10 is gradually unfolded, FIG. 14A is a side view illustrating the side surface of FIG. 12, and FIG. 14B is a side view illustrating the side surface of FIG. 13.

Referring to FIGS. 10 to 13, the rollable display according to the second aspect of the present disclosure, which is designated by reference numeral 2000, includes a display unit DP and a link unit 700. Here, the rollable display 2000 according to the second aspect of the present disclosure uses the name "rollable display" since the display unit DP implements folding multiple times, but may also be applied to the field of a foldable display.

The display unit DP includes the flexible display panel 100 and the back plate 200. Here, a detailed description of the display unit DP is the same as the above description of the flexible display panel 100 and the back plate 200, and thus will be omitted below.

As illustrated in FIG. 8, the back plate 200 is composed of the folding portions IF and OF and the unfolding portions UF, and the folding portions include the outer folding portions OF and the inner folding portions IF, which are alternately arranged, so that the display unit DP is rolled or folded in a zigzag pattern.

In the display unit DP described above, the unfolding portions UF are coupled onto the link unit 700 so that the folding portions OF and IF are folded and unfolded according to the folding and unfolding of the link unit 700.

FIG. 11 illustrates the state in which the display unit DP is unfolded to about 30% from the state of FIG. 10, FIG. 12 illustrates the state in which the display unit DP is unfolded to about 50% from the state of FIG. 10, and FIG. 13 illustrates the state in which the display unit DP is unfolded to 100% to become a plane. Accordingly, the greater the degree of unfolding of the link unit 700, the more the display unit DP is unfolded, and the more closely the same resembles the shape of a flat panel display. When the link unit 700 is completely unfolded, the display unit DP is unfolded 100% to form a plane.

Here, since the display unit DP includes the outer folding portions OF and the inner folding portions IF, which are alternately arranged, the display unit DP is not folded multiple times in a single direction. This may prevent separation between the flexible display panel 100 and the back plate 200.

The link unit 700 includes a first shaft 710, a first link joint 711, and a second link joint 712.

The first shaft 710 is coupled to the center of the first link joint 711, and each end of the first shaft 710 is coupled to the center of the first link joint 711. In addition, the first shaft 710 may be rotatably coupled to the center of the first link joint 711. This serves to allow the display surface, which is the upper surface of the display unit DP, to be disposed in a plane while the link unit 700 is being folded or unfolded in the state in which the display unit DP is coupled to the first shaft 710. In addition, this also serves to prevent deformation or damage to the display unit DP by allowing tensile or compressive stress to be evenly distributed to each of the folding portion and the unfolding portion while the display unit DP is being folded or unfolded.

The second link joint 712 is disposed at the outer side of the first link joint 711, and is coupled at the center thereof to the first shaft 710, which is a rotating shaft, in the same manner as the first link joint 711. In addition, the first link joint 711 and the second link joint 712 may have the same length.

As such, a pair of first link joints 711 is disposed parallel to each other at both ends of the first shaft 710 and a pair of second link joints 712 is disposed parallel to each other at both ends of the first shaft 710 so that substantially "X"-shaped link joints are provided.

Here, a second shaft 720 and a third shaft 730 are provided respectively at the front and the rear of the first shaft 710 so as to be parallel to the first shaft 710 in a first direction. Similarly, two pairs of first and second link joints 721 and 722 are disposed respectively at both ends of the second shaft 720, and two pairs of first and second link joints 731 and 732 are disposed respectively at both ends of the third shaft 730. Then, one end of the first link joint 711 of the first shaft 710 is connected to the upper end of the second link joint 722 of the second shaft 720, and the other end of the first link joint 711 of the first shaft 710 is connected to the lower end of the second link joint 732 of the third shaft 730. In addition, one end of the second link joint 712 of the first shaft 710 is connected to the upper end of the first link joint 731 of the third shaft 730, and the other end of the second link joint 712 of the first shaft 710 is connected to the lower end of the first link joint 721 of the second shaft 720. In this way, the respective link joints may be rotated in cooperation with each other, and the rotation angle thereof or the distance to which the display unit DP is unfolded may be the same for each link joint.

Individual first link joints 711, 721 and 731 and second link joints 721, 722 and 732 are rotatable relative to each other in different directions about the rotation axis of respective shafts 710, 720 and 730. For example, when the first link joint 711 is rotated in a given direction and the second link joint 712 is rotated in the opposite direction about the rotation axis of the first shaft 710, the link unit 700 and the display unit DP are unfolded. Conversely, when the first link joint 711 is rotated in the opposite direction and the second link joint 712 is rotated in the given direction about the rotation axis of the first shaft 710, the display unit DP is folded via a plurality of folding regions.

One end of the display unit DP is coupled to the printed circuit board 500. Of course, the printed circuit board 500 may be a flexible printed circuit board, and may include a drive unit (not illustrated), although not illustrated in the drawings. Here, the printed circuit board 500 is formed so as to have a length equal to or less than the length of the unfolding portion UF of the display unit DP which is not folded or the length of the first link joint 711 or the second link joint 712. Thus, even in the state in which the display unit DP is completely folded, the printed circuit board 500 is disposed between the unfolding portions UF so that the printed circuit board 500 or the drive unit is not exposed to the outside. Of course, when the printed circuit board 500 or the drive unit has a greater size, the printed circuit board 500 or the drive unit may be disposed at the lower side of the link unit 700 or at the lower side of the display unit DP so as not to be exposed to the outside during the operation of the display 2000.

Figure 15:
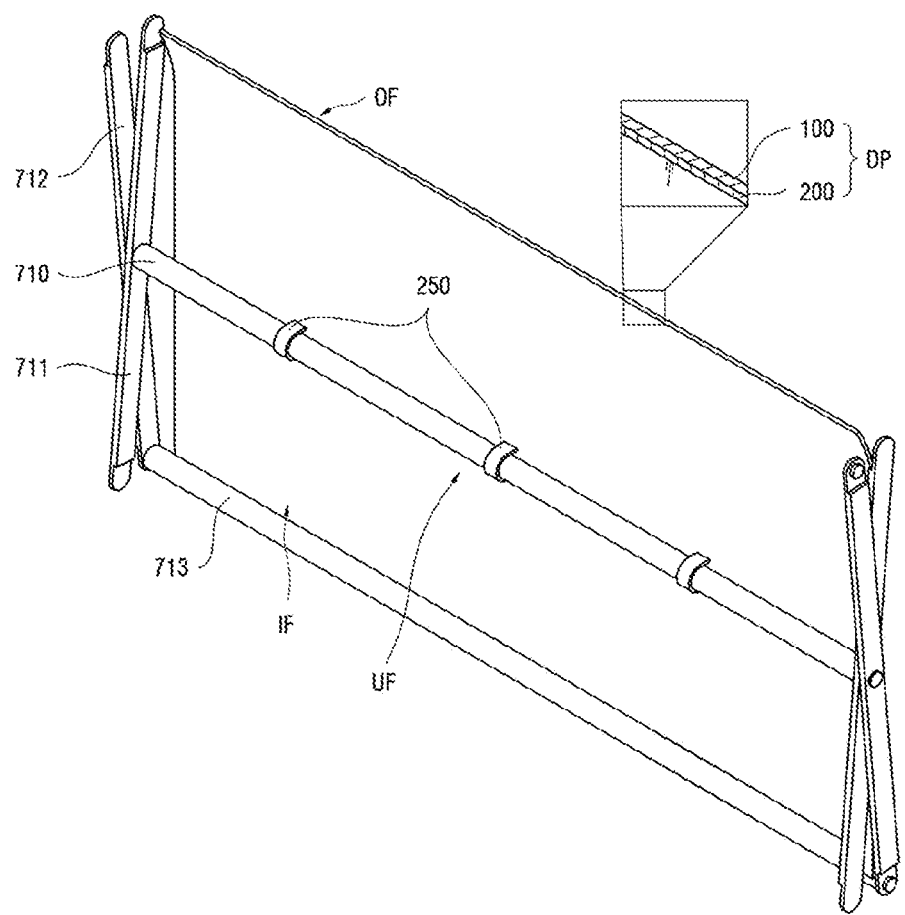
FIG. 15 is a reference view illustrating a portion of the interior of FIG. 10.

FIG. 15 is a reference view illustrating a portion of the interior of FIG. 10.

Referring to FIG. 15, the display unit DP is provided on the rear surface thereof with a hook member 250. In the display unit DP, at least one hook member 250 is disposed in each unfolding portion UF on the rear surface of the back plate 200. The hook member 250 is coupled to a corresponding shaft and functions to fix the display unit DP to the link unit 700. The hook member 250 may first be coupled to the shaft so that an assembly of the hook member 250 and the shaft is coupled to the rear surface of the back plate 200. Alternatively, the hook member 250, which is separate from the shaft, may be coupled to the rear surface of the back plate 200, and thereafter, may be interference-fitted to the shaft.

Here, in each unfolding portion UF of the back plate 200, the hook member 250 coupled to the first shaft 710 and a hook member coupled to the second shaft or the third shaft may be positioned so as not to interfere with each other during the folding of the display unit DP.

In addition, three or more hook members 250 may be provided equidistantly or at positions close to both ends of one shaft on the back plate 200.

The hook member 250 may be necessary for each shaft 710, 720 or 730, which is coupled to the center of the first link joint 711, 721 or 731, and a side shaft 713 may be provided so as to interconnect at least one end of both ends of the respective first link joints, which face each other. More particularly, the side shaft 713 is positioned on the lower end of the first link joint 711. Since the display unit DP may maintain a planar form in the completely unfolded state thereof only when the rear surface of the display unit DP is supported by the respective shafts, the side shaft 713 is positioned on the lower end of the first link joint. Of course, the side shaft 713 may also function to increase stiffness during the folding of the link unit.

As is apparent from the above description, a rollable display of the present disclosure has the following effects.

A back plate, which serves to support a flexible display panel, is divided into a plurality of areas in a manner such that an inner folding portion and an outer folding portion are alternately repeated with an unfolding portion therebetween, which makes the lengths of paths, along which the display panel and the back plate are folded, equal so as to prevent slippage between the two. Thereby, a rollable display, in which no visibility defect is observed, may be realized.

In addition, a display unit is coupled onto a link unit so as to be folded by alternately repeating inward folding and outward folding. Thereby, it is possible to provide a rollable display, which is capable of preventing separation between a flexible display panel and a back plate and ensuring easy folding of the display unit.

Although the aspects of the present disclosure have been described above in detail with reference to the accompanying drawings, it will be apparent to those skilled in the art that the present disclosure described above is not limited to the aspects described above, and various substitutions, modifications, and alterations may be devised within the spirit and scope of the present disclosure. Thus, such modifications should be considered to fall within the scope of the present disclosure, and the true technical scope of the present disclosure should be determined by the technical ideas of the claims to be set forth below.

What is claimed is:

1. A rollable display comprising:
   a display unit including a flexible display panel having a front surface where an image is displayed and a back plate disposed in contact with a rear surface of the flexible display panel and provided with a plurality of alternately arranged folding portions and non-folding portions; and
   a link unit coupled to a rear surface of the back plate to allow the folding portions of the display unit to alternately fold inwardly and outwardly in multiple times, wherein the link unit includes:
   a plurality of first shafts coupled to the non-folding portions in a first direction on the rear surface of the flexible display panel;
   a first link joint rotatably coupled to each end of a corresponding first shaft; and
   a second link joint coupled to the first shaft at an outer side of the first link joint.

2. The rollable display according to claim 1, wherein one end of the first link joint of the first shaft is connected to an upper end of the second link joint, which is coupled to each end of a second shaft, which is disposed at a front of the first shaft in the first direction, and the other end of the first link joint of the first shaft is connected to a lower end of the second link joint, which is coupled to each end of a third shaft, which is disposed at a rear of the first shaft in the first direction,
   wherein one end of the second link joint of the first shaft is connected to an upper end of the first link joint, which is coupled to each end of the third shaft, which is disposed at the rear of the first shaft in the first direction, and the other end of the second link joint of the first shaft is connected to a lower end of the first link joint, which is coupled to each end of the second shaft, which is disposed at the front of the first shaft in the first direction, and the first and second link joints are rotated in cooperation with each other.

3. The rollable display according to claim 2, wherein the display unit is unfolded to a planar form when the first link joint rotates in a given direction and the second link joint rotates in an opposite direction about a rotation axis of the first shaft, and
   wherein the display unit is folded to have a plurality of folding regions when the first link joint rotates in the opposite direction and the second link joint rotates in the given direction.

4. The rollable display according to claim 3, wherein the display unit includes at least one hook member provided on a rear surface of each unfolding portion of the back plate and coupled to a corresponding one of the first to third shafts to fix the display unit to the link unit.

5. The rollable display according to claim 4, wherein a position where the hook member coupled to the first shaft does not interfere with a position where the hook member is coupled to the second shaft or the third shaft.

6. The rollable display according to claim 3, further comprising a side shaft disposed parallel to the first shaft to connect at least one end of both ends of the first link joint, wherein the rear surface of the display unit is supported by or coupled to the side shaft.

7. The rollable display according to claim 1, further comprising a printed circuit board connected to one end of the display unit,
   wherein the printed circuit board is formed to have a length equal to or shorter than a length of the first link joint or a length of the second link joint.

8. The rollable display according to claim 1, wherein a length of the first link joint is the same as a length of the second link joint.

* * * * *